(12) United States Patent
Ota et al.

(10) Patent No.: US 6,235,548 B1
(45) Date of Patent: May 22, 2001

(54) METHOD OF FABRICATING NITRIDE SEMICONDUCTOR LASER

(75) Inventors: Hiroyuki Ota; Yoshinori Kimura; Mamoru Miyachi, all of Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/461,035

(22) Filed: Dec. 15, 1999

(30) Foreign Application Priority Data

Dec. 18, 1998 (JP) .................................................. 10-361147

(51) Int. Cl.$^7$ .................................................. H01L 21/00
(52) U.S. Cl. .................................................. 438/46
(58) Field of Search .................................. 438/45, 46, 47, 438/507, 508, 509, 535; 117/952; 372/43, 44, 45, 46

(56) References Cited

PUBLICATIONS

Amano, H. et al., "p–type conduction in Mg–doped GaN treated with low energy electron beam irradiation (LEEBI)", Jap. J. Appl. Phys. vol. 28, pp. L2112–L2114, Dec. 1989.*

Nakamura, s. et al., "Thermal annealing effects on p–type Mg–doped GaN films", Jpn. J. Appl. Phys. vol. 31, pp. L139–142, Feb. 1992.*

* cited by examiner

*Primary Examiner*—Keith Christianson
(74) *Attorney, Agent, or Firm*—Sughrue, Mion, Zinn, Macpeak & Seas, PLLC

(57) ABSTRACT

The disclosure is a method for fabricating a nitride semiconductor laser device of group-III nitride semiconductor having a substrate. The method includes a step of forming a crystal layer made of a group-III nitride semiconductor $(Al_xGa_{1-x})_{1-y}In_yN$ ($0 \leq x \leq 1$, $0 \leq y \leq 1$) having an added group II element over the substrate; a step of heating the crystal layer up to a predetermined temperature in a thermal treatment atmosphere and maintaining the predetermined temperature for a first time period; and a step of introducing a hydrocarbon gas into the thermal treatment atmosphere for at least a partial time period within the first time period. The method further includes a step of irradiating an electromagnetic wave or photons to the crystal layer in the at least a partial time period, wherein the electromagnetic wave or photons have an energy greater than an energy forbidden band width of the group III nitride semiconductor in the crystal layer.

12 Claims, 5 Drawing Sheets

METHOD OF FABRICATING NITRIDE SEMICONDUCTOR LASER

BACKGROUND OF THE INVENTION

1. Field of the Invention

The present invention relates to a group III nitride semiconductor device (also referred to herein as a device) and, particularly to a process for producing the same.

2. Description of the Related Art

In the art of a luminous device such as a light emitting diode, a semiconductor laser diode or the like, there is known a luminous device or opto-electronic device comprising a crystal layer including a single crystal of group III nitride semiconductor $(Al_xGa_{1-x})_{1-y}In_yN$ ($0 \leq x \leq 1$, $0 \leq y \leq 1$) to which group II elements such as magnesium (Mg), zinc (Zn) or the like are added, which is attractive as a wide gap semiconductor expected to be a material for a device capable of emitting blue light.

A group III nitride crystal made of aluminum (Al), gallium (Ga), indium (In) and nitrogen (N) [$(Al_xGa_{1-x})_{1-y}In_yN$ ($0 \leq x \leq 1$, $0 \leq y \leq 1$)] to which group II elements such as Mg, Zn or the like are added, is produced by the metal-organic chemical vapor deposition (MOCVD) which is normally used for epitaxial growth of the nitride semiconductor. This so-called group II added group III nitride crystal as it is immediately after epitaxial growth has a high resistance. Therefore, even if a blue light emitting diode is produced in the basis of group II added group III nitride crystal layers, it is difficult to provide an electric current to the as grown group II added group III nitride.

Recently, a reforming method have been reported that a high resistance $(Al_xGa_{1-x})_{1-y}In_yN$ ($0 \leq x \leq 1$, $0 \leq y \leq 1$) crystal to which Mg or Zn is added is reformed to a low-resistivity p-type crystal by means of a specific treatment. H. Amano et al. discloses that a low-resistivity p-type crystal is established by performing a low energy electron beam irradiation treatment to such a crystal (H. Amano, M. Kito, K. Hiramatsu and I. Akasaki, Jpn. J. Appl. phys. Vol. 28, 1989, pp-L2112–L2114). Further, S. Nakamura et al. also discloses that a low-resistivity p-type crystal is achieved by performing a thermal annealing treatment under a pressurized or atmospheric pressure in an atmosphere of nitrogen to such a crystal (S. Nakamura, T. Mukai, M. Senoh, N. Iwasa, Jpn. J. Appl. Phys. Vol. 31, 1992, pp-L139–L142).

The mechanism of the foregoing treatments for establishing the p-type layer is interpreted as follows: The hydrogen atoms are combined to the group II acceptor impurities such as Mg or the like in the layer formation and neutralizing the acceptors. There ocuur dissociation and elimination of hydrogen atoms due to the above treatments.

The foregoing low energy electron beam irradiation treatment provides an excellent p-type GaN film having a high hole carrier concentration at room temperature of E18/cc order. However, the treated depth is restricted by the penetration depth of the electron beam. In the case that the accelerating voltage for electrons of from 6 kV to 30 kV is used, the treated depth is approximately 0.3 μm from the surface of GaN film as described in Nakamuraet. al. (S. Nakamura, T. Mukai, M. Senou and N. Iwasa, Jpn. J. Appl. Phys. Vol. 31, 1992, pp-L139–L142). In addition, the electron beam is scanned on the surface of the wafer one by one in the low energy electron beam irradiation treatment, so that the increase of the treatment time per one wafer causes problems in the mass production of the device.

On the other hand, the foregoing thermal annealing treatment does not restrict any treated depth caused by the penetration depth of the electron beam. Furthermore, the thermal annealing treatment is advantageous in the mass production of the device, since a plurality of the wafers can be introduced into a heating furnace to be performed the annealing process. There is however a drawback in the thermal annealing treatment discovered by Nakamura et. in which, as seen from the Nakamura's experiment, the resultant hole carrier concentration at room temperature of 3E17/cc is lower than that of the low energy electron beam irradiation treatment. The value of 3E17/cc hole carrier concentration at room temperature is enough to produce a p-n junction diode which is a basic element of the light emitting diode or semiconductor laser and thus such a thermal treatment is used in practical for the manufacturing of emitting diodes.

In case of the manufacturing for the semiconductor laser device using the particular thermal treatment, a problem of contact resistance at the electrode portion remains due to the hole carrier concentration at room temperature of about 3E17/cc. Moreover, when raising the treatment temperature in expectation of increasing the hole carrier concentrations at room temperature of the whole films, and then nitrogen atoms are dissociated adjacent to the outer surface of the film to generate vacant holes of nitrogen, so that vacant holes of nitrogen serve as donors to compensate acceptors. On the contrary to the expectation, the hole carrier concentration is reduced adjacent to the outer surface of the film. As a result, the contact condition at the electrode portion becomes inferior. In addition, the elevation of the annealing temperature readily promotes a mutual diffusion between the internal matrix elements of the device and the acceptor impurities of the growth layer.

OBJECT AND SUMMARY OF THE INVENTION

It is therefore an object of the present invention to provide a process for producing a group III nitride semiconductor device including a step of thermal annealing treatment for the p-type establishment of a crystal layer made of group III nitride semiconductor (AlxGa1-x)1-yInyN($0 \leq x \leq 1$, $0 \leq y \leq 1$) having an added group II element, in order to increase the hole carrier concentration in the crystal layer, so that the annealing temperature is lowered.

A process for producing a nitride semiconductor laser device of group-III nitride semiconductor having a substrate according to a first aspect of the present invention, comprises the steps of:

forming a crystal layer made of a group-III nitride semiconductor $(Al_xGa_{1-x})_{1-y}In_yN$ ($0 \leq x \leq 1$, $0 \leq y \leq 1$) having an added group II element over the substrate;

heating said crystal layer up to a predetermined temperature in a thermal treatment atmosphere and maintaining said predetermined temperature for a first time period; and introducing a hydrocarbon gas into said thermal treatment atmosphere for at least a partial time period within said first time period.

In an embodiment of the fabrication method according to the invention, said hydrocarbon gas consists of unsaturated hydrocarbon molecules each having at least one double or triple bond such as ethylene, propylene, butadiene in gaseous phase.

In another embodiment of the fabrication method according to the invention, said hydrocarbon gas may be an ethane, propane or butane gas.

In a second aspect of the invention, the foregoing fabrication method further comprises a step of irradiating an electromagnetic wave or photons to said crystal layer in said at least a partial time period, wherein said electromagnetic wave or photons have an energy greater than an energy forbidden band width of the group III nitride semiconductor (AlxGa1-x)1-yInyN($0 \leq x \leq 1$, $0 \leq y \leq 1$) said crystal layer.

In another embodiment of the fabrication method according to the invention, in said heating treatment of the crystal layer, said predetermined temperature is a temperature ranging from 300° C. to 1000° C.

In a further embodiment of the fabrication method according to the invention, said heating treatment further comprises a step of maintaining the irradiation of said electromagnetic wave or photons after said first time period for a time period in which said crystal layer cools down to 300° C. or less.

In a still further embodiment of the fabrication method according to the invention, the crystal layer of the nitride semiconductor is formed through metal-organic chemical vapor deposition.

According to the first invention, in the thermal treatment atmosphere e.g., nitrogen gas ($N_2$) ambient thermal annealing for establishing a p-type layer, hydrocarbon compound gas, for example, gas of unsaturated hydrocarbon molecules each having at least one double or triple bond, is added to the nitrogen gas, whereby the hole carrier concentration is improved in the gallium nitride crystal layer even if the annealing is performed through a conventional temperature condition.

According to the second invention, radiation i.e., electromagnetic wave including photons or light is provided to the surface of the semiconductor crystal layer in addition to the foregoing hydrocarbon compound gas, in the thermal treatment atmosphere thermal annealing treatment. As a result, it is possible to decrease the annealing temperature. The used electromagnetic wave or photons has an energy greater than an energy forbidden band width of the group III nitride semiconductor (AlxGa1-x)1-yInyN($0 \leq x \leq 1$, $0 \leq y \leq 1$) of the outer crystal layer. Therefore, an UV ray of 365 nm wavelength light may be used for gallium nitride (GaN) semiconductor.

DETAILED DESCRIPTION OF THE PREFERRED EMBODIMENTS

An embodiments of fabrication for a group-III nitride semiconductor laser of the present invention is described below by referring to the accompanying drawings.

Embodiments of a group III nitride semiconductor laser of the present invention are described below by referring to the accompanying drawings.

Figure 1:
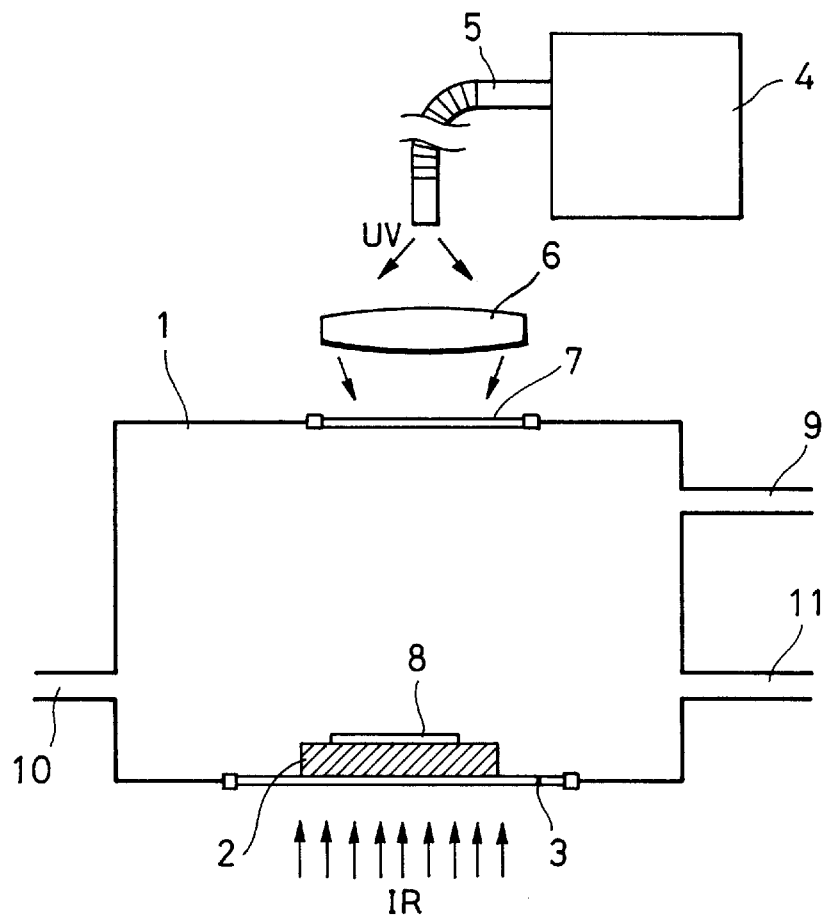
FIG. 1 is a schematic sectional view of a device for performing the thermal treatment used for a method for fabricating a group III nitride semiconductor laser device according to the invention.

FIG. 1 shows an example of a device for performing the thermal treatment used for a method for fabricating a group III nitride semiconductor laser device according to the invention. The device can be used for first and second embodiments of the invention, since the difference of both the embodiments is the existence of electromagnetic wave radiation step.

A stainless thermal treatment reactor 1 shown in FIG. 1 includes a graphite susceptor 2 for carrying a device wafer 8 i.e., GaN sample. The susceptor 2 may be heated by an infrared radiation lamp (not shown) through a silica glass window 3 disposed beneath the susceptor. Light of ultraviolet radiation generated by an ultraviolet radiation source 4 is provided to the device wafer 8 on the susceptor 2 through an optical fiber 5, a silica glass converging lens 6 and a silica glass top window 7 of the thermal treatment reactor 1. The thermal treatment reactor 1 communicates with a vacuum pump (not shown) via an outlet pipe 9 which makes a vacuum in the thermal treatment reactor. The thermal treatment reactor 1 is provided with an atmosphere gas inlet pipe 10 and a gas outlet pipe 11 for exhausting gases.

Figure 2:
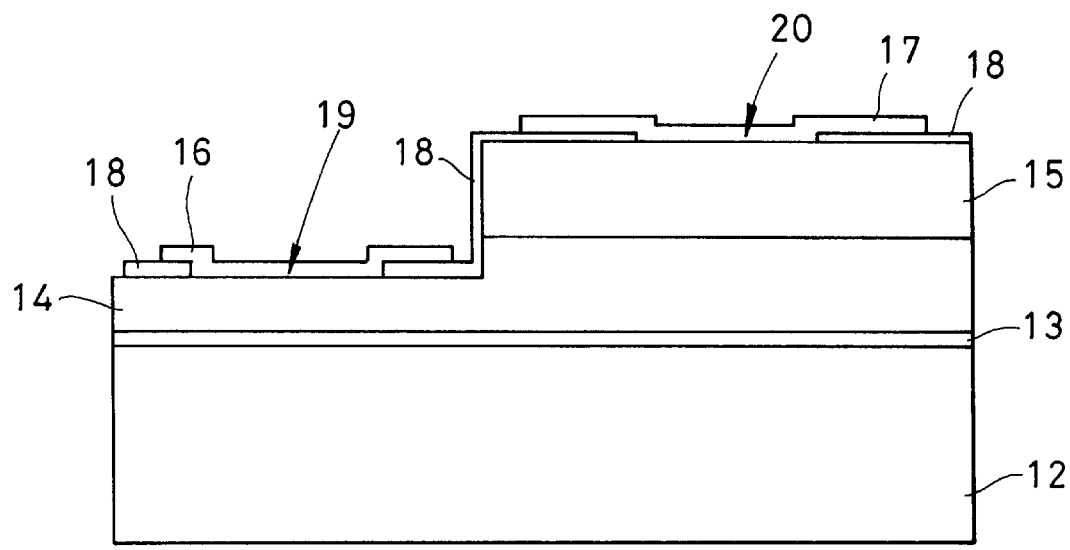
FIG. 2 is a schematic constructive cross-sectional view illustrating a blue light emitting diode of p-n junction-type having a group III nitride semiconductor to which a group II element added manufactured by an embodiment according to the present invention.

As shown in FIG. 2, a first or second embodiment of light emitting diode comprises a sapphire substrate 12, and a buffer layer 13 of aluminum nitride (AlN), a Si-doped n-type GaN layer 14, and a Mg-doped GaN layer 15 which are layered in turn on the substrate. Electrodes 16 and 17 are formed to be connected to the n-type GaN layer 14 and Mg doped GaN layer 15 through the window portions 19 and 20 respectively. A protective layer 18 of silicon dioxide ($SiO_2$) is formed to protect the surface over the whole device except the electrodes.

FORMATION OF DEVICE WAFER

A substrate 12 of sapphire is set into a reactor of film-forming i.e., metal-organic chemical vapor deposition (MOCVD) growth reactor and then held for 10 minutes in a hydrogen-gas flow at a pressure of 300 Torr and a temperature of 1050° C. to thermally clean the surface of the substrate. Thereafter, the temperature of the sapphire substrate is lowered to 600° C. Gases of ammonia ($NH_3$) which is a nitrogen material and TMA (trimethyl aluminium) which is an Al material, are introduced into the growth reactor to deposit a buffer layer 13 made of AlN up to a thickness of 20 nm. Next, supply of TMA is stopped, the temperature of the substrate is raised to 1050° C. again while flowing only $NH_3$, and then trimethyl gallium TMA is introduced to form a GaN ground layer 14 on the buffer layer 13. In this case, Me—$SiH_3$ (methyl silane) is added into a growth atmospheric gas as the material of Si serving as an n-type impurity. When the n-type GaN ground layer 14 is grown to approximately 2 $\mu$m, supply of Me—$SiH_3$ is stopped. Instead, Et—$CP_2$Mg (ethyl cyclopentadienyl magnesium) as the material of Mg serving as a p-type impurity is introduced to form the p-type GaN layer 15. When the Mg doped GaN layer 15 is grown to approximately 1 $\mu$m, then supply of material gases other than $NH_3$ are stopped and at the same time, the cooling of the substrate is started. When the substrate temperature reaches at room temperature, the sapphire device wafer is taken out of the reactor.

P-TYPE ESTABLISHMENT

<FIRST EMBODIMENT>

The wafer taken out from the MOCVD reactor is set into the thermal treatment reactor 1 shown FIG. 1 and fixed on the susceptor 2. The vacuum pump (not shown) makes vacuum inside of the thermal treatment reactor by drawing air via the outlet pipe 9. After that, a mixture nitrogen gas consisting of a high purity nitrogen gas and ethylene ($C_2H_4$) at 0.5% is introduced into the chamber through the gas inlet pipe 10 to exchange vacuum for the nitrogen gas. When the nitrogen gas reaches at atmospheric pressure, the gas outlet pipe 11 is opened to make a treatment gas flow inside of the reactor. The susceptor with the device wafer is heated up to a temperature 800° C. by using the infrared radiation lamp. After that, this condition is maintained for 20 minutes. After the maintaining period, the cooling of the substrate is started. When the substrate temperature reaches at room temperature, the gas flow of the nitrogen gas with ethylene is stopped. After the exhausting of the gas to be vacuum, the sapphire device wafer is taken out of the thermal treatment reactor.

<SECOND EMBODIMENT>

The wafer taken out from the MOCVD reactor is set into the thermal treatment reactor 1 shown FIG. 1 and fixed on the susceptor 2. The vacuum pump (not shown) makes vacuum inside of the thermal treatment reactor by drawing air via the outlet pipe 9. After that, a high purity nitrogen gas including 1,3-butadiene (1,3-$C_4H_6$) at 0.5% is introduced into the chamber through the gas inlet pipe 10 to exchange vacuum for the nitrogen gas. When the nitrogen gas reaches at atmospheric pressure, the gas outlet pipe 11 is opened to make a treatment gas flow inside of the reactor. The susceptor with the device wafer is heated up to a temperature 400° C. by using the infrared radiation lamp and provided with ultraviolet radiation from the ultraviolet radiation source 4. After that, this condition is maintained for 20 minutes while maintaining the ultraviolet radiation. After the maintaining period, the cooling of the substrate is started. When the substrate temperature reaches at a temperature 300° C. or less, the UV radiation and the gas flow of the nitrogen gas with butadiene are stopped. After the exhausting of the gas to be vacuum, the sapphire device wafer is taken out of the thermal treatment reactor.

FORMING OF ELECTRODES FOR DEVICE

Next, for the first and the second embodiments, an etching mask is formed on the Mg doped GaN layer of the device wafer by using the photolithography technology and thus unnecessary portions of the Mg doped GaN layer 15 are partially etched and removed by using the reactive ion etching (RIE) so that some portions of the n-type GaN layer 14 is exposed outside.

Next, these exposed layers 14 and 15 are coated with a photoresist and then island-masks are formed for contact-holes for electrodes by using the photolithography technology so that other than the masks is removed. Thus, the $SiO_2$ protective layer 18 are deposited of the surface of the substrate by the sputtering method. After that, the photoresist and unnecessary portions of the $SiO_2$ protective layer are partially removed through the lift-off method so as to form contact-holes or the window portion 19 and 20 through which the layers 14 and 15 are partially exposed.

Titanium (Ti) is vapor-deposited on the n-type GaN layer 14 through the window portion 19 at a 50 nm thickness by using a mask, and subsequently aluminum (Al) is similarly vapor-deposited at a 200 nm thickness, so that the n-side electrode 16 electrically connected to the layer 14 is formed so as to cover the contact hole. Similarly, there is formed the p-side electrode 17 comprising a nickel (Ni) layer of a 50 nm thickness and a gold (Au) layer of a 200 nm thickness vapor-deposited in order at the window portion 20 exposing the p-type GaN layer 15.

After that, each resultant wafer is cut into a plurality of chips of device by a cutting machine such as a dicing machine. The resultant devices are measured in the electric characteristics.

Figure 3:
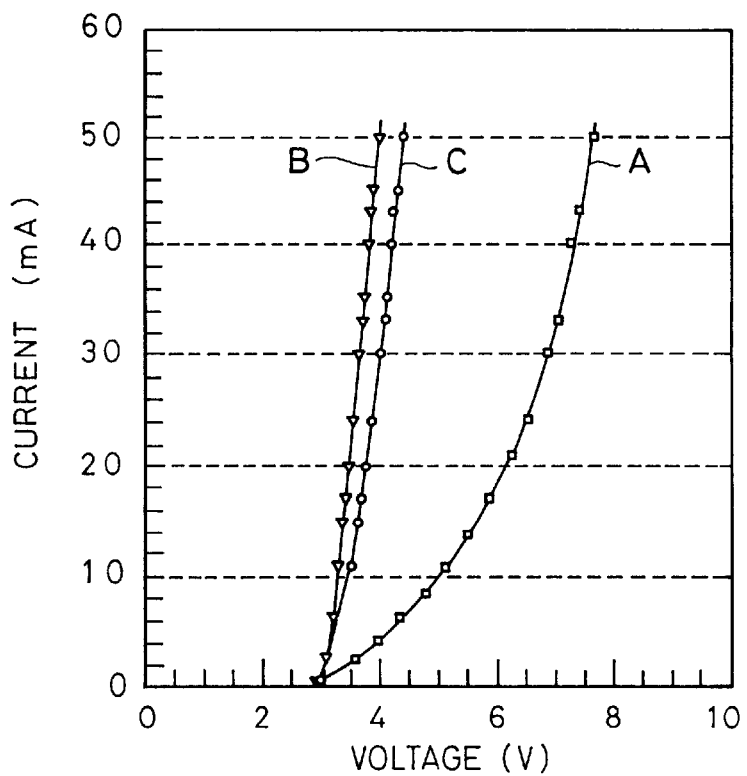
FIG. 3 is a graph showing a current versus voltage characteristics of the p-n junction light emitting diode of an embodiment according to the invention diode.

FIG. 3 shows a current versus voltage (I–V) characteristics (Curve B) of the resultant light emitting diode device of the first embodiment which is treated by the $N_2$ gas flow including the hydrocarbon gas under the annealing temperature 800° C. for 20 minutes.

To compare a conventional device with the invention, a comparative light emitting diode device is prepared which is formed in the same manner as the first embodiment except that a $N_2$ gas flow without hydrocarbon gas is employed in the treatment for normal p-type establishment under 800° C. for 20 minutes. FIG. 3 (Curve A) shows a current versus voltage (I–V) characteristics of the comparative device. In the case of the comparative device (Curve A), the characteristics has a gentle bend at a rising voltage i.e., threshold voltage higher than approximately 3.4V which is expected value calculated in the basis of the band gap of GaN. This fact shows the existence of some potential barrier at the p-side electrode.

On the other hand, characteristics (Curve B) shown in FIG. 3 of the first embodiment is remarkably improved in comparison with the conventional device, the ohmic nature of the electrode is established.

FIG. 3 (Curve B) shows a I–V characteristics of the resultant light emitting diode device of the foregoing second embodiment. The second embodiment has substantially the same ohmic characteristics as the first embodiment.

MECHANISM OF THE INVENTION

The mechanism of the method of the invention will be described in view of the problem of the conventional method and the cause thereof below in detail.

In the Mg doped GaN layer ($Al_xGa_{1-x}$)$_{1-y}In_yN$ ($0 \leq x \leq 1$, $0 \leq y \leq 1$) grown through the MOCVD method, Mg elements incorporate with hydrogen atoms dissociated from $NH_3$ and then some complexes are formed, so that the acceptor impurities Mg are neutralized. The number of hydrogen atoms is nearly equal to that of doped Mg atoms appearing in the GaN layer. It is therefore inferred from this that hydrogen is trapped in the complex form includes Mg—H in the GaN layer. Hydrogen is dissociated from the layer by performing the nitrogen ambient thermal treatment at 800° C. for 20 minutes as above mentioned, and then acceptors appear in the layer by a suitable quantity for the difference between the Mg atomic concentration and the hydrogen atomic concentration remaining after the thermal treatment. In the case of the nitrogen ambient thermal treatment with a 800° C. for 20 minutes, it is assumed that the final hole carrier concentration is determined by the quantity of dissociated hydrogen rather than the doped Mg concentration in the layer.

Hydrogen dissociation from the Mg doped GaN layer is imperfect. This is because there is a rate-determining step in the dissociation series.

In the as-grown Mg doped GaN layer, some Mg atoms associate with hydrogen in the Mg—H complex form. The heating at approximately 300° C. disassociates the Mg—H complex. The dissociation of such a complex by heating is briefly partially represented as the following formula (1).

$$Mg-H \rightarrow Mg^- + H^+ \qquad (1)$$

Although the dissociated hydrogen $H^+$ readily diffuses within the layer, the $H^+$ is not readily eliminated from the surface of the layer. This is because the individual $H^+$ is proton and the nitrogen gas atmospheric outside of the layer prevents from the hydrogen diffusion out of the surface of the layer. Hydrogen atoms dissociate from the layer in the form of $H_2$ gas.

The $H_2$ generation step for the hydrogen dissociation includes a neutralizing step that $H^+$ acquires a negative charge to be neutralized, $$H^+ + e^- \rightarrow H^0 \qquad (2)$$

and, an associating step that two neutralized $H^0$ are associated to become hydrogen molecule ($H_2$), $$H^0 + H^0 \rightarrow H_2 \qquad (3).$$

In the case that energies of charged hydrogen ($H^+$, $H^-$ and $H^0$) in the GaN crystal are computed, the energy of the charged status of $H^0$ is higher than that of $H^+$ or $H^-$ in any of the Fermi level conditions. In other words, the neutralized $H^0$ is unstable. This implies that the foregoing neutralizing step should be described as below, $$H^+ + e^- \leftrightarrows H^0 \qquad (4).$$

In view of the thermal stability of hydrogen, it is necessary for the activation of the reaction of $H_2$ molecule formation to increase the portion promoting toward the right hand of this reaction (4). However, the lower the hydrogen concentration goes down in the layer, the lower the speed of the reaction goes down. That is, the reaction's speed is in proportion to the advance of p-type establishment due to the thermal treatment. This is because two neutralized hydrogen atoms $H^0$ are associated on the surface of the layer to make the hydrogen molecule $H_2$.

The electron in the foregoing reaction (2) is an electron in the conductive band of GaN. Therefore, no electron exists in the insulator layer before the thermal treatment. When the GaN layer is of a high temperature e.g., 800° C. or more, GaN semiconductor becomes intrinsic and pairs of electron and hole are generated in the layer. It is expected to these electrons contribute to the reaction (2). However, since GaN band gap is about 3.4 eV, the generated electron concentration in this mechanism is very low.

In addition, the layer is p-typed at the beginning of p-type establishment due to the thermal treatment, the Fermi level approaches the valence electron band. The electron concentration of the conduction band is decreased sharply, and thus the speed of the reaction (2) is reduced.

In view of the above discussion, the rate-determining step against the hydrogen dissociation out of the layer is of the foregoing neutralizing step (2) and the associating step that two neutralized $H^0$ are associated (3).

The present invention has been made on the basis of the above discussion.

In the case of the first embodiment according to the invention, a gas molecule species such as $C_2H_4$ which reacts with the neutralized hydrogen atom (so called hydrogen radicals), is added to the thermal treatment atmosphere, whereby the neutralized hydrogen atom is removed out of the layer without being dependent on the association reaction of the neutralized hydrogen atoms. The reaction of atomic hydrogen and ethylene is expressed below, $$H + C_2H_4 \rightarrow H_2 + C_2H_3 \qquad (5).$$

As a result, a $C_2H_3$ radical is generated.

In practice, when the GaN layer is subjected to the thermal annealing treatment, some nitrogen atoms in the layer are slightly removed therefrom, so that semimetal Ga appears in the surface of the laler, in which Ga serves as a catalyst. As a result, the following reaction occurs to provide ethyl radical, $$H + C_2H_4 + Ga \rightarrow C_2H_5 + Ga \qquad (6).$$

This reaction has a reaction speed remarkably higher than the reaction (5).

In the case of the second embodiment according to the invention, in addition to the first embodiment, light energy is provided to the layer in the thermal treatment atmosphere to energize electrons in the layer, whereby the neutralizing reaction is promoted so to facilitate the hydrogen dissociation out of the layer all the more. It is not necessary to make the elevation of a high temperature higher than 800° C. or more, since the UV radiation generates necessary electrons promoting the reaction (2). The treatment temperature is set at 400° C. in the foregoing second embodiment, since the Mg—H complex is dissociated with a temperature of approximately 300° C. Butadiene readily traps the Hydrogen radicals at comparatively low temperature. In this case, 1,3-butadiene is employed.

In the case of the foregoing first embodiment, ethylene is employed. Moreover, a molecule having an unsaturated bond or double bond may be employed such as propylene ($C_3H_6$) for reaching a target advantageous effect above mentioned. In addition, since the thermal treatment temperature is relatively high, molecule without any unsaturated bond or double bond may be employed such as ethane ($C_2H_6$), isobutane (i—$C_4H_{10}$) or the like in the first embodiment, but methane ($CH_4$) has a low reactivity and its effective merit is not expected.

Since the annealing temperature is low in the second embodiment, reactivity at a low temperature is needed. Therefore, it is preferable to use the foregoing propylene ($C_3H_6$) or the like belonging to the molecule species having a double bond.

In the first and the second embodiments, the practically used gas in the ambient gas in the annealing treatment is preferably in a gas phase at room temperature and atmospheric pressure, although the molecule species having many carbons has a higher reactivity with hydrogen atom. In this view, the usable saturated compound is ranging from ethane to butane or derivatives thereof, and the usable unsaturated compound is ranging from ethylene to butylene or butadiene or derivatives thereof in praoctice.

Although the p-n homo-junction diode is described in each of those embodiments, the invention is not limited by such a diode. The invention is effective in the double hetero structure, SCH (separate confinement hetero structure), quantum well laser structure or the like, and also in the manufacturing of the unipolar transistor device such as a p-channel FET.

In this way, the present invention provides a p-type GaN layer with a high carrier concentration at which the normal thermal treatment does not accomplishes yet. Further, the method of the second embodiment enables to perform the thermal annealing treatment at a low temperature, so that there are prevented from mutual diffusion between the internal matrix elements and the deterioration of the device caused by a high temperature annealing treatment.

In the second embodiment according to the invention, there is a step of maintaining the UV radiation of electromagnetic wave after the GaN layer cools down to 300° C. or less. This is because as follows:

The dissociated H⁺ in the GaN layer generated by annealing keeps an equilibrium with neutralized status below.

$$H^+ + e^- \leftrightharpoons H^0$$

Although $H^0$ is not in a stable status, the concentration of $H^0$ influenced by the penetration depth of the UV radiation is higher than that of the normal thermal equilibrium status under the condition of UV radiation. This is because electrons in the conductive band are energized in the depth region of the layer to which the UV radiation penetrates. When cooling the layer after the radiation, the remaining $H^0$ dissociates into $H^+$ and $e^-$, an then $H^+$ combines with $Mg^-$ again and $e^-$ combines with hole to disappear. On the other hand, when cooling the layer while keeping the UV radiation to the layer (but $H^0$ is not the stable status), electron system deviates from the thermal equilibrium due to the UV radiation and at the same time the layer cools down, then $H^0$ is froze to a quasi-stable status. The $e^-$ is in the conductive band and back to the normal thermal equilibrium status. The $H^0$ in quasi-stable status does not combine with the Mg acceptors. As the result, the effective acceptor concentration increases in the surface of the layer.

<THIRD EMBODIMENT>

Figure 4:
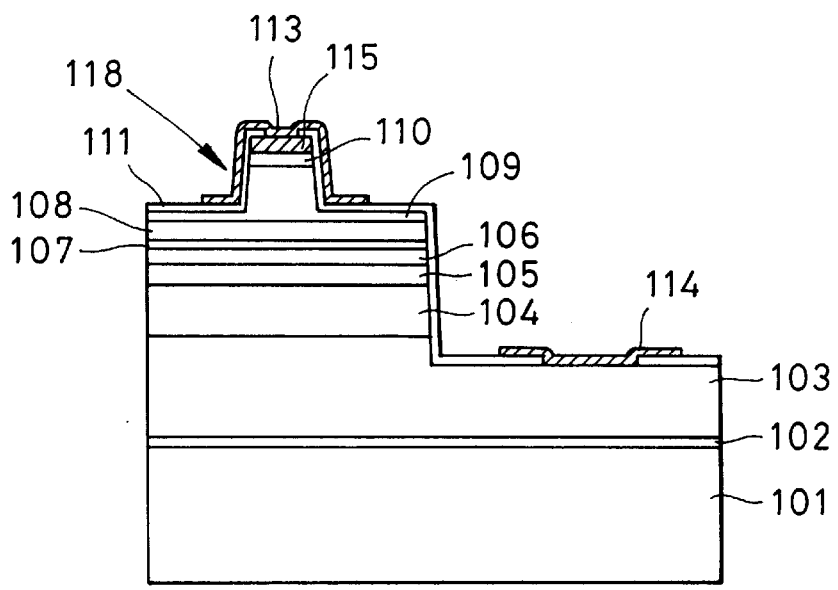
FIG. 4 is a schematic constructive cross-sectional view illustrating a ridge type semiconductor laser device having a group III nitride semiconductor to which a group II element added manufactured by another embodiment according to the present invention.

In addition to the first and the second embodiment of p-n homo-junction diodes, a third embodiment will be described below. FIG. 4 shows the third embodiment of a ridge type semiconductor laser device having the group-III nitride semiconductor in the SCH structure.

The semiconductor laser device shown in FIG. 4 is constituted of a GaN (or AlN) layer 102 formed at a low temperature, n-type GaN layer 103, n-type $Al_{0.1}Ga_{0.9}N$ layer 104, n-type GaN layer 105, active layer 106 mainly containing InGaN, p-type $Al_{0.2}Ga_{0.8}N$ layer 107, p-type GaN layer 108, p-type $Al_{0.1}Ga_{0.9}N$ layer 109, and p-type GaN layer 110 which are superimposed on the single crystal sapphire substrate 101 in order. An n-side electrode 114 and p-side electrodes 113 and 115 are connected to the n-type GaN layer 103 and p-type GaN layer 110. A ridge stripe portion 118 is formed on the p-type $Al_{0.1}Ga_{0.9}N$ layer 109. The element is covered with and protected by an insulating film 111 made of $SiO_2$ except electrodes.

This semiconductor laser device emits light by recombining an electron with a hole in the active layer 106. The n-type GaN layer 105 and p-type GaN layer 108 respectively serve as a guide layer. Light generated in the active layer 106 is guided in the guide layers 105 and 108. Electrons and holes are effectively confined in the active layer 106 by setting band gaps of the guide layers 105 and 108 to values larger than that of the active layer 106. The p-type $Al_{0.2}Ga_{0.8}N$ layer 107 serves as a barrier layer for further enhancing the confinement of carriers (particularly, electrons), the n-type $Al_{0.1}Ga_{0.9}N$ layer 104 and the p-type $Al_{0.1}Ga_{0.9}N$ layer 109 serve as cladding layers respectively each formed to have a refractive index lower than those of the guide layers 105 and 108. The wave guidance in the film-thickness direction is performed due to the difference between refractive indexes of the cladding layer and the guide layer. The ridge stripe portion 118 is formed in order to produce a lateral-directional step in an effective refractive index by changing the thickness of the cladding layer 109, thereby confining generated light in the lateral direction.

The n-type GaN layer 103 is a ground layer formed as a current path because sapphire serving as a substrate does not have any electric conductivity. Moreover, the GaN (or AlN) layer 102 formed as a low temperature growth layer is a so-called buffer layer that is formed to give a smoothing film on the sapphire substrate that is a different material for GaN.

The device structure shown in FIG. 4 is fabricated in the following fabricating steps.

First, the sapphire substrate 101 is set into a film-forming MOCVD growth reactor and held for 10 minutes in a hydrogen-gas flow at a pressure of 300 Torr and a temperature of 1050° C. to thermally clean the surface of the sapphire substrate 101. Thereafter, the temperature of the sapphire substrate 101 is lowered to 600° C., and ammonia ($NH_3$) for a nitrogen material and TMA (trimethyl aluminium) for an Al material are introduced into the growth reactor to deposit a buffer layer 102 made of AlN up to a thickness of 20 nm.

After that, supply of TMA is stopped, and then the temperature of the sapphire substrate 101 on which the buffer layer 102 is formed is raised to 1050° C. again while flowing only $NH_3$, and TMG (trimethyl gallium) is introduced to form the n-type GaN ground layer 103 on the buffer layer 102. In this case, Me—$SiH_3$ (methyl silane) is added into a growth atmosphere gas as the material of Si serving as an n-type impurity.

Figure 5:
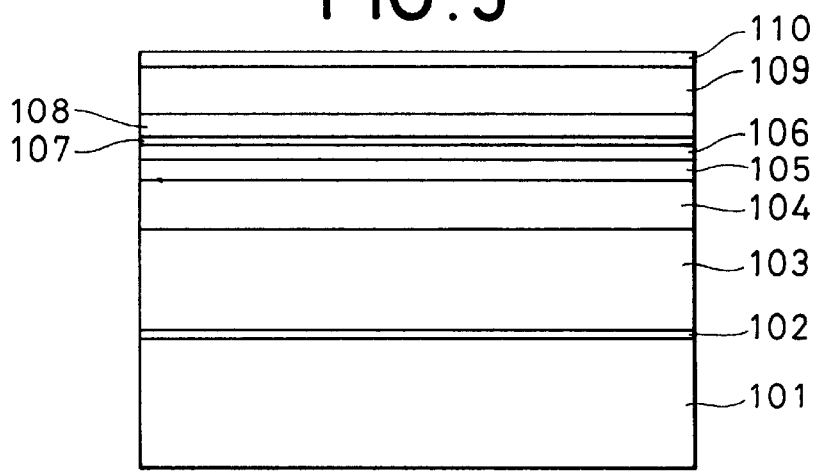
FIGS. 5 to 10 are schematic sectional views each showing a laser substrate in the semiconductor-laser fabricating step of another embodiment of the present invention.

When the n-type GaN ground layer 103 is grown up to approximately 4 μm, only supply of TMG is stopped. Then the supply quantity of Me—$SiH_3$ (methyl silane) is increased and kept its supply. After this condition is maintained for 3 minutes, the supply quantity of Me—$SiH_3$ is decreased to a necessary value for an n-type layer while TMG is introduced again and, at the same time TMA is introduced to form the n-type AlGaN cladding layer 104. When the n-type AlGaN cladding layer 104 is grown to approximately 0.5 μm, supply of TMA is stopped to grow the n-type GaN guide layer 105 up to 0.1 μm. When growth of the n-type GaN guide layer 105 is completed, supply of TMG and Me—$SiH_3$ is stopped, and lowering of temperature is started to set the substrate temperature to 750° C. When the substrate temperature reaches at 750° C., carrier gas is changed from hydrogen to nitrogen. When the gas-flow state is stabilized, TMG, TMI, and Me—$SiH_3$ are introduced to grow the active layer 106. When the active layer is formed, then supply of TMG, TMI, and Me—$SiH_3$ is stopped, and the carrier gas is changed from nitrogen to hydrogen. When the gas-flow state is stabilized, the substrate temperature is raised to 1050° C. again and TMG, TMA, and Et—$CP_2Mg$ (ethyl cyclopentadienyl magnesium) as the material of Mg serving as a p-type impurity are introduced to form the p-type GaN layer 107 on the active layer 106 up to 0.01 μm. After that, supply of TMA is stopped to grow the p-type GaN guide layer 108 up to 0.1 μm and TMA is introduced again to grow the p-type AlGaN cladding layer 109 up to 0.5 μm. Moreover, the p-type GaN contact layer 110 is grown on the layer 109 up to 0.1 μm and resulting in formation of a device wafer as shown in FIG. 5. Thereafter, supply of TMG and Et—$CP_2Mg$ is stopped and lowering of temperature is started. When the substrate temperature reaches at 400° C., supply of $NH_3$ is also stopped. When the substrate temperature reaches at room temperature, the sapphire substrate 101 is taken out of the reactor.

Figure 6:
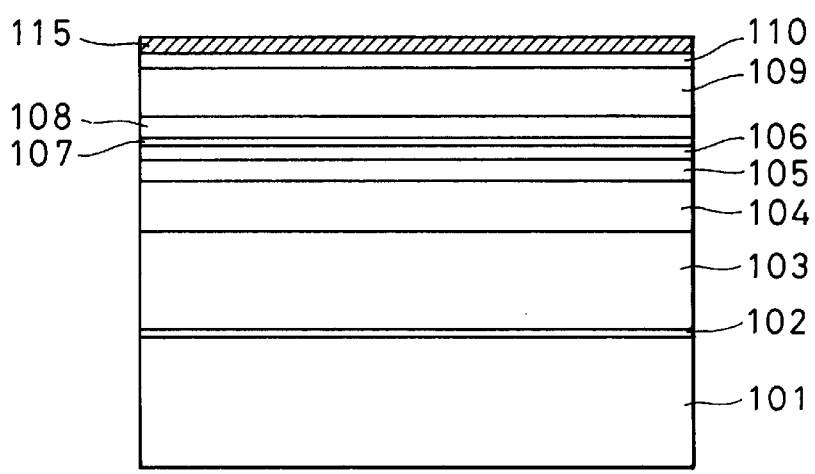

As shown in FIG. 6, a nickel (Ni) layer 115 with a thickness of 200 nm is formed on the surface of the wafer as a p-side electrode by using the vacuum deposition.

Figure 7:
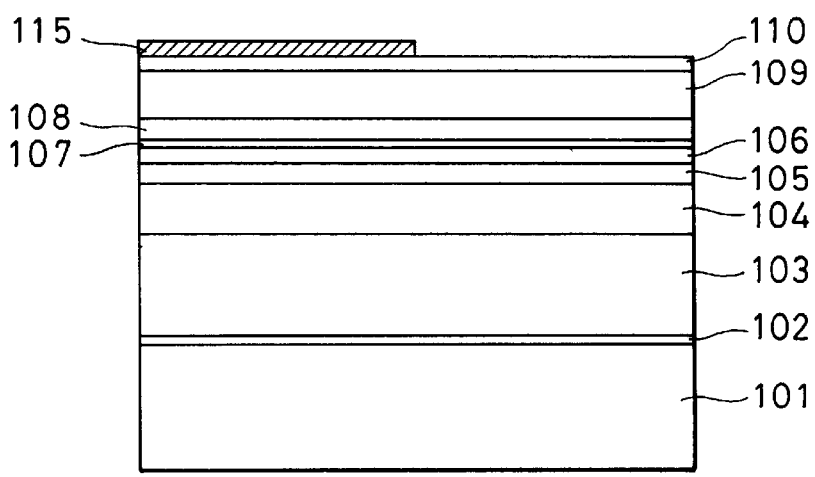

Then, as shown in FIG. 7, the Ni film 115 is locally removed through wet etching.

Figure 8:
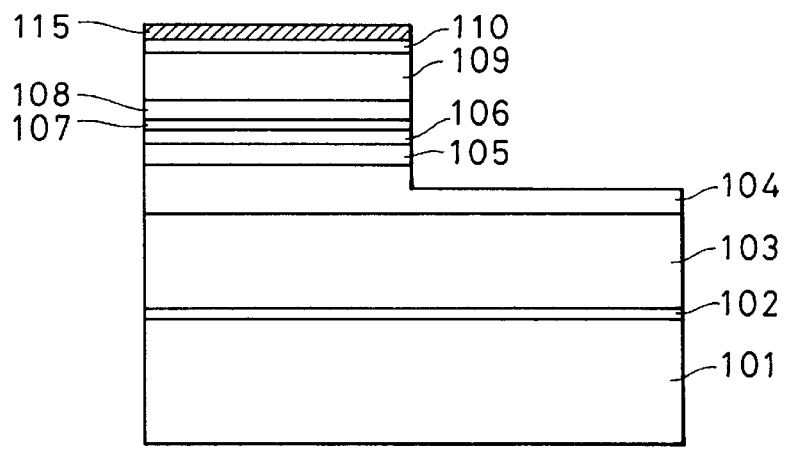

Then, as shown in FIG. 8, the exposed nitride semiconductor layer is etched through reactive ion etching (RIE) using $Cl_2$ (chlorine) gas by using the remaining Ni film 115 as a mask. In this case, as shown in the figure, etching is performed up to a depth when the n-type cladding layer 104 is slightly left to form a terrace.

Figure 9:
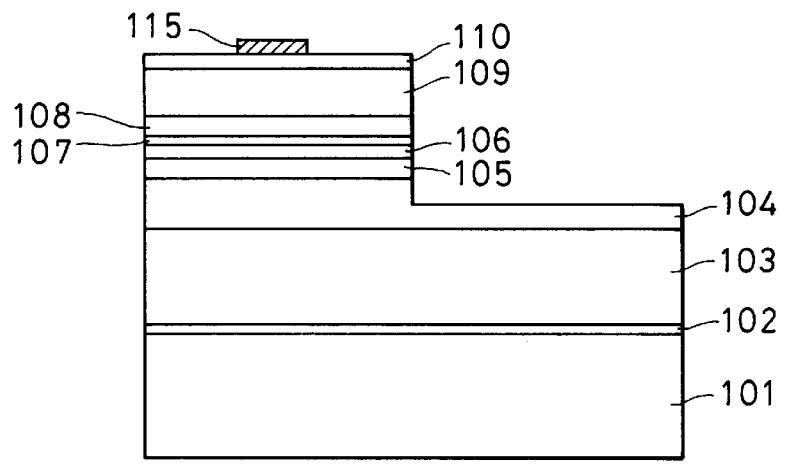

Then, as shown in FIG. 9, the Ni film is removed through wet etching while leaving a width of 5 μm to form the stripe 115 of the 5 μm-wide Ni film.

Figure 10:
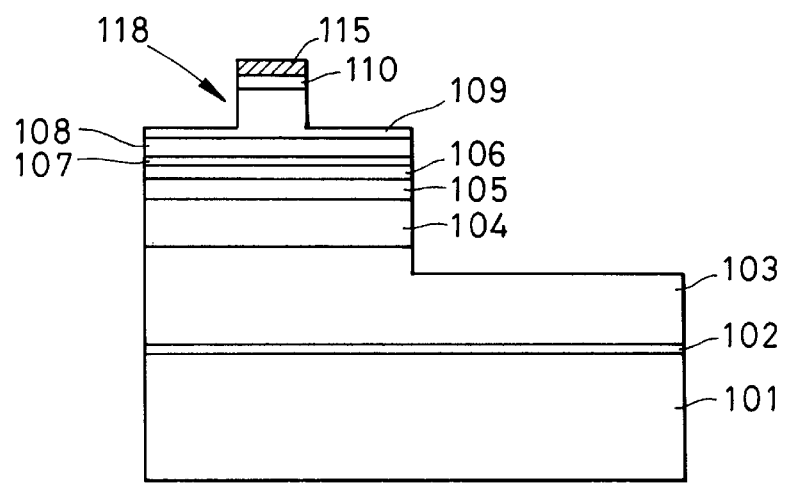

Then, as shown in FIG. 10, by using the Ni stripe 115 as a mask, the contact layer 110 and p-type AlGaN cladding layer 9 are removed through reactive ion etching (RIE) other than the portion immediately beneath the 5 μm-wide stripe 115, resulting in leaving approximately 0.1 μm of the cladding layer 9 to form the narrow ridge stripe structure 118. In this case, the remaining n-type cladding layer 104 is simultaneously removed and the n-type GaN ground layer 103 is locally exposed.

The device wafer is subjected to the thermal treatment in such a manner that it is set into the thermal treatment reactor 1 used in the foregoing embodiments as shown FIG. 1.

After making vacuum inside of the thermal treatment reactor, a high purity nitrogen gas including ethylene ($C_2H_4$) at 0.5% is introduced into the reactor to exchange the vacuum for the nitrogen gas. When the nitrogen gas reaches at atmospheric pressure, the gas outlet pipe is opened to make a treatment gas flow inside of the reactor. The susceptor with the device wafer is heated up to a temperature 600° C. by using the infrared radiation lamp. After that, this condition is maintained for 20 minutes. After the maintaining period, the cooling of the substrate is started. When the substrate temperature reaches at room temperature, the gas flow of the nitrogen gas with ethylene is stopped. After the exhausting of the gas to be vacuum, the device wafer is taken out of the thermal treatment reactor.

As shown in FIG. 4, a $SiO_2$ protective film 111 is deposited on the wafer by sputtering or the like. Thereafter, a 3 μm-wide window portions for p-type and n-type electrodes are formed in the $SiO_2$ protective film at the p-type ridge portion 118 and the terrace respectively by using the normal photolithography.

On the portion where the n-type GaN layer 103 is exposed, Ti (titanium) is vapor-deposited up to 50 nm and then Al is vapor-deposited up to 200 nm to form the n-side electrode 114. Then, on the portion where a p-type GaN layer is exposed, Ni is vapor-deposited up to 50 nm and Au is vapor-deposited up to 200 nm to form the p-side electrode 113. Thus, the device structure shown in FIG. 10 is completed on the wafer.

To compare a conventional device with the invention, a comparative laser device is fabricated. The comparative device is formed in the same manner as the third embodiment except that the thermal treatment is performed, before the Ni deposition step shown in FIG. 6, under the condition with a pure $N_2$ gas flow without hydrocarbon gas at 800° C. for 20 minutes and that the reactive etching step shown in FIG. 10 is omitted.

Figure 11:
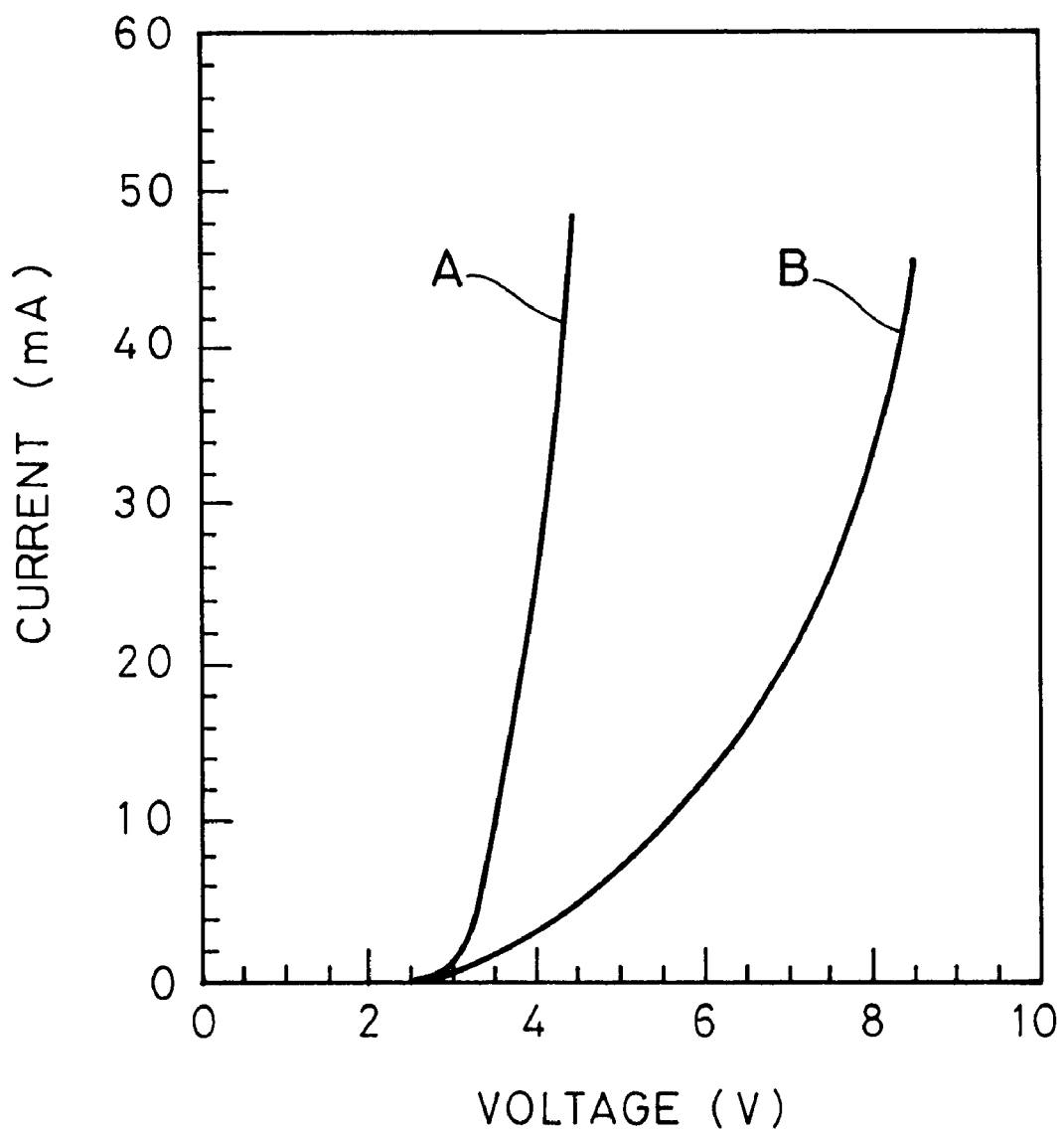
FIG. 11 is a graph showing a current versus voltage characteristics of the p-n junction light emitting diode of an embodiment according to the invention diode in comparison with that of a conventional semiconductor laser.

After that, each resultant wafer is cut into a plurality of chips of device by a cutting machine such as a dicing machine. The resultant devices are measured in the current versus voltage (I–V) characteristics. FIG. 11 (Curve A) shows the I–V characteristics of the device of the third embodiment. FIG. 11 (Curve B) shows the I–V characteristics of the comparative device. As seen from the graph, the characteristics of the third embodiment is improved.

The characteristics of conventional device is inferior to those of the first and the second embodiment device. This is because the area of the p-side electrode is smaller than that of the homo junction device.

In the case of the third embodiment, the device surface of the ridge portion is coated with the Ni film during the thermal treatment, but the 5 μm-wide Ni film is remarkably small. Therefore, hydrogen is dissociated from the both ends and side surfaces of the ridge portion. Moreover, since Ni serves as a good catalyst in the reaction that $C_2H_4$ traps a hydrogen atom (H), an effective thermal treatment is achieved even at a low temperature of 600° C. Furthermore, the Ni film prevents from nitrogen dissociation from the surface of the p-type layer. Consequently, electrode's property may be kept at a good status. When nitrogen dissociates from GaN, nitrogen vacancies serves as donors and compensates acceptors. Therefore, in the case that the thermal treatment temperature is high, the hole carrier concentration on the surface of p-GaN becomes low and thus the ohmic nature of the electrode deteriorates.

According to the invention, the addition of hydrocarbon compound gas the ambient atmosphere is performed during the thermal treatment. Therefore, the hole carrier concentration in the crystal layer is improved. Further, the foregoing addition of hydrocarbon compound gas and the light radiation onto the surface of the semiconductor crystal layer are performed during the thermal treatment. Therefore, the invention enables to lower the thermal annealing treatment temperature.

It is to be noted that the embodiment and examples to be described below simply illustrates the invention, and the invention is not limited thereto. Namely, the invention may be applied to not only the p-n junction-type light emitting diode but also the pin-junction-type emitting device comprising an intrinsic layer disposed between the p-type and the n-type semiconductor layers.

What is claimed is:

1. A method for fabricating a nitride semiconductor laser device of group-III nitride semiconductor having a substrate, the method comprising the steps of:

forming a crystal layer made of a group-III nitride semiconductor ($Al_xGa_{1-x})_{1-y}In_yN$ ($0 \leq x \leq 1$, $0 \leq y \leq 1$) having an added group II element over the substrate;

heating said crystal layer up to a temperature in a thermal treatment atmosphere and maintaining said temperature for a first time period; and introducing a hydrocarbon gas into said thermal treatment atmosphere for at least a partial time period within said first time period.

2. A method for fabricating a nitride semiconductor laser device according to claim 1, wherein said hydrocarbon gas consists of unsaturated hydrocarbon molecules each having at least one double or triple bond.

3. A method for fabricating a nitride semiconductor laser device according to claim 2, wherein said hydrocarbon gas is ethylene gas.

4. A method for fabricating a nitride semiconductor laser device according to claim 2, wherein said hydrocarbon gas is propylene gas.

5. A method for fabricating a nitride semiconductor laser device according to claim 2, wherein said hydrocarbon gas is butadiene gas.

6. A method for fabricating a nitride semiconductor laser device according to claim 1, wherein said hydrocarbon gas is ethane gas.

7. A method for fabricating a nitride semiconductor laser device according to claim 1, wherein said hydrocarbon gas is propane gas.

8. A method for fabricating a nitride semiconductor laser device according to claim 1, wherein said hydrocarbon gas is butane gas.

9. A method for fabricating a nitride semiconductor laser device according to claim 1 further comprising a step of irradiating an electromagnetic wave or photons to said crystal layer in said at least a partial time period, wherein said electromagnetic wave or photons have an energy greater than an energy forbidden band width of the group III nitride semiconductor (AlxGa1-x)1-yInyN($0 \leq x \leq 1$, $0 \leq y \leq 1$) in said crystal layer.

10. A method for fabricating a nitride semiconductor laser device according to claim 1, wherein said temperature is a temperature ranging from 300° C. to 1000° C.

11. A method for fabricating a nitride semiconductor laser device according to claim 9 further comprising a step of maintaining the irradiation of said electromagnetic wave or photons after said first time period for a time period in which said crystal layer cools down to 300° C. or less.

12. A method for fabricating a nitride semiconductor laser device according to claim 1, wherein the crystal layer of the nitride semiconductor is formed through metal-organic chemical vapor deposition.

* * * * *